United States Patent [19]

George

[11] Patent Number: 5,341,071

[45] Date of Patent: Aug. 23, 1994

[54] PIECEWISE LINEARIZED FOCUS VOLTAGE CIRCUIT FOR TELEVISION APPARATUS

[75] Inventor: John B. George, Carmel, Ind.

[73] Assignee: Thomson Consumer Electronics, Inc., Indianapolis, Ind.

[21] Appl. No.: 115,603

[22] Filed: Sep. 3, 1993

[51] Int. Cl.⁵ .............................. H01J 29/58
[52] U.S. Cl. .............................. 315/382.1
[58] Field of Search .................... 315/382, 382.1

[56] References Cited

U.S. PATENT DOCUMENTS

| | | | |
|---|---|---|---|
| 4,028,586 | 6/1977 | Mengle | 315/368 |
| 4,361,785 | 11/1982 | Stapleton | 315/389 |
| 4,473,780 | 9/1984 | Gent | 315/382 |
| 4,485,335 | 11/1984 | Eames, Jr. | 315/382 |
| 4,644,230 | 2/1987 | Federle | 315/382 |
| 5,162,705 | 11/1992 | Golik | 315/382 |

Primary Examiner—Theodore M. Blum
Attorney, Agent, or Firm—Joseph S. Tripoli; Joseph J. Lake; Sammy S. Henig

[57] ABSTRACT

A temperature compensated vertical rate trapezoidal waveform is produced using piecewise linearization technique. The waveform is applied to a focus electrode of a cathode ray tube to provide a dynamic focus voltage.

10 Claims, 1 Drawing Sheet

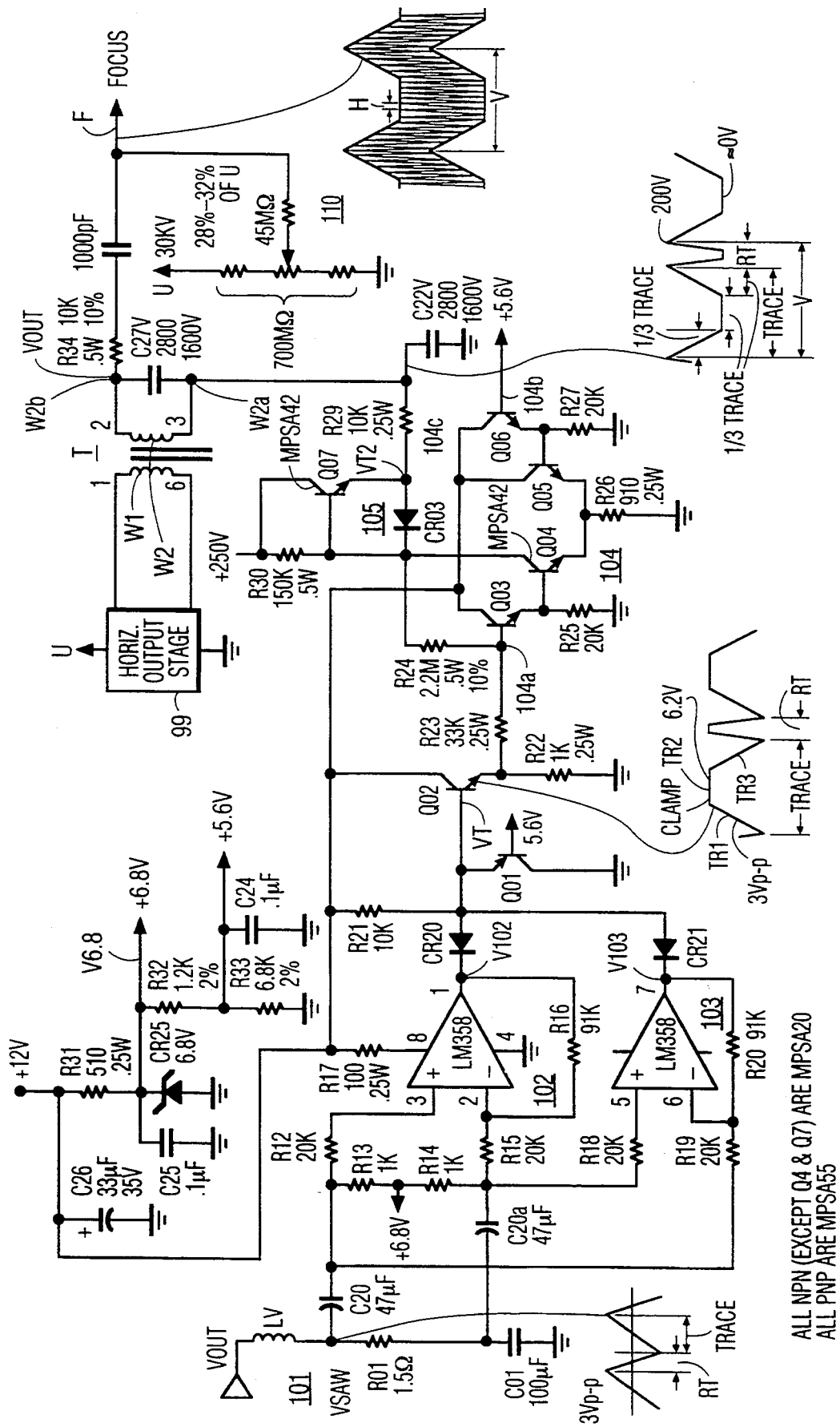

PIECEWISE LINEARIZED FOCUS VOLTAGE CIRCUIT FOR TELEVISION APPARATUS

This invention relates to modulated focus voltage circuits for television apparatus.

The need for focus control is well understood in the art. It was experienced early in television apparatus as an incident to the scanning of cathode-ray tubes because the distance from the center of deflection to the scanned raster is not uniform. Actually, that distance varies markedly as the beam is deflected horizontally and vertically from the central portion of the screen and, consequently, defocusing is most severe at the corners of the raster. The adaption of picture tubes of increased size and wider deflection angles in recent years has emphasized the defocusing effect at the corners of the scanning pattern.

Efforts have been made to control focus in electrostatically focused tubes by changing the magnitude of the focus potential with displacement of the beam from the center of the raster. This technique is referred to as dynamic focusing. It comprises the application of a unidirectional potential to the focus electrode of the electrostatically focused cathode-ray tube to establish the proper focus condition at the center of the raster and the concurrent application of a suitable varying potential to preserve that condition throughout the scanning raster. Since, in the usual case, the beam focus changes approximately in accordance with a parabolic function along either scanning direction, the varying components of focus potential may have a parabolic waveform in both axes.

Typically, a vertical rate parabolic waveform is produced by integrating a sawtooth waveform that is synchronized to, for example, a vertical deflection current. Also, multiplication can be used. Disadvantageously, both techniques may require complex circuitry.

In accordance with an aspect of the invention, a vertical rate trapezoidal waveform is produced from a vertical sawtooth signal using a piecewise linearization technique. The trapezoidal waveform is applied to the focus electrode and approximates the aforementioned parabolic waveform. Because no signal integration is required, the circuitry may be less expensive and better controlled.

A focus voltage generating apparatus, embodying an aspect of the invention, with deflection frequency modulation of the focus voltage, includes a source of a first signal at a frequency that is related to a deflection frequency. A switching arrangement is responsive to the first signal for producing piecewise linearized portions of a modulation signal, during corresponding portions of a trace interval of a deflection cycle. The focus voltage is modulated in accordance with the modulation signal.

The sole FIGURE illustrates a dynamic focus voltage generating circuit 100, embodying an aspect of the invention. A conventional vertical deflection circuit 101, not shown in detail, generates in a sampling resistor R01 that is coupled in series with a vertical deflection winding LV a vertical rate sawtooth VSAW. During a trace interval TRACE, signal VSAW is substantially a linear upramping voltage. During a retrace interval RT, signal VSAW is a downramping voltage.

Signal VSAW is AC coupled to a non-inverting input terminal of an amplifier 102 operating as a non-inverting amplifier. An inverting input terminal of amplifier 102 is AC coupled via a capacitor C20a to a DC blocking capacitor C01 that is coupled in series with resistor R01. A voltage V6.8 at 6.8 V is coupled via a resistor R13 to the non-inverting input terminal and via a resistor R14 to the inverting input terminal of amplifier 102. Such an arrangement requires only a positive supply voltage of 12 V and no negative supply voltage for energizing amplifier 102.

Amplifier 102 produces an output signal V102 that varies in a ramping manner, during vertical trace interval TRACE. Similarly, signal VSAW is AC coupled to an amplifier 103 operating as an inverting amplifier. Amplifier 103 produces an output signal V103 that varies in a ramping manner but at opposite direction or phase with respect to signal V102, during interval TRACE. Signals V102 and V103 are selectively coupled via diodes CR20 and CR21, respectively, operating as switches to an emitter of a clamp transistor Q01. A clamping reference voltage that is equal to 5.6 V is developed at a base of transistor Q01.

In accordance with an aspect of the invention, during approximately the beginning third of the length of interval TRACE, upramping signal V102 is smaller than 5.6 V. Therefore, diode CR20 conducts and clamp transistor Q01 is nonconductive. An upramping portion TR1 of a trapezoidal signal VT is developed at the emitter of transistor Q01. Following interval TR1, when signal V102 exceeds 5.6 V, diode CR20 becomes nonconductive and signal VT is clamped by transistor Q01 to a voltage that is equal to a clamp level VCLAMP. Level VCLAMP is equal to 6.2 V or the sum of 5.6 V and the forward emitter-base voltage of transistor Q01. Transistor Q01 maintains signal VT at level CLAMP for approximately one third of the length of interval TRACE to form a portion TR2. Thereafter, during the last third of interval TRACE, downramping signal V103 is smaller than the difference between level VCLAMP and the forward voltage of diode CR21. Consequently, diode CR21 conducts and transistor Q01 is nonconductive. As a result, a downramping portion TR3 of signal VT is produced. During vertical retrace interval RT, the waveform of signal VT has no significance because of vertical blanking. Trapezoidal signal VT is coupled via an emitter follower transistor Q02 to a resistor R23 that is coupled to an inverting input terminal 104a of an amplifier 104.

In accordance with an inventive feature, during ramping portions TR1 and TR3, temperature related variation of the forward voltage of diode CR20 or CR21 is compensated and prevented from affecting the emitter voltage of transistor Q02 by the corresponding variation of the base-emitter forward voltage of transistor Q02. Similarly, during portion TR2, temperature related variation of the forward voltage of transistor Q01 is compensated by that of transistor Q02.

Amplifier 104 that is responsive to the temperature compensated emitter voltage of transistor Q02 is formed by a pair of transistors Q03 and Q06, each operating in an emitter follower configuration, having emitters that are coupled to the bases of a pair of transistors Q04 and Q06, respectively. Transistors Q04 and Q06 are coupled to each other as a transistor pair forming a differential amplifier. A collector of transistor Q04 is coupled to a conventional boot-strap pull-up arrangement 105. Arrangement 105 includes a collector load resistor R30 of transistor Q04 that is coupled to a supply voltage of +250 V. An active pull-up transistor Q07 operating as an emitter follower when the collector voltage of transistor Q04 increases has a base that is coupled to the collector of transistor Q04. A diode CR03, coupled between the emitter of transistor Q07 and the collector of transistor Q04, provides an active pull-down current path when the collector voltage of transistor Q04 decreases. A negative feedback path forming resistor R24 is coupled between inverting input terminal 104a and the collector of transistor Q04.

A voltage reference, developed at a non-inverting input terminal 104b of amplifier 104, is equal to the emitter voltage of transistor Q02 when transistor Q01 performs clamping operation. Resistor R24 causes the collector voltage and, hence, a voltage VT2 at an output terminal 104c of amplifier 104 to be approximately 0 V when the emitter voltage of transistor Q02 is nominally equal to 5.6 V, during portion TR2 of signal VT. During portion TR3 of signal VT, voltage VT2 at terminal 104c is downramping, whereas, during portion TR1, it is upramping. The gain of amplifier 104 is such that the peak level of trapezoidal voltage VT2 at terminal 104c is 200 V.

Advantageously, because of common mode cancellation, the waveform of voltage VT2 is not degraded or changed when supply voltages change within a wide tolerance range. Furthermore, the same circuit can be used without modification with different vertical deflection frequencies because it is insensitive to frequency variations.

Trapezoidal voltage VT2 at the vertical rate V developed at terminal 104c is coupled to an end terminal W2a of a secondary winding W2 of a transformer T. A horizontal rate signal produced in a conventional manner in a horizontal output stage 99 is applied to a winding W1 of transformer T. An output signal VOUT, developed at a terminal W2b of winding W2 is equal to the sum of the vertical rate waveform at terminal W2a and a horizontal rate signal developed in winding W2. Signal VOUT is AC-coupled to a focus electrode F for providing dynamic focus voltage. Signal VOUT is superimposed on a high level DC voltage produced in a voltage divider 110 from an ultor voltage U in a conventional manner.

What is claimed is:

1. A focus voltage generating apparatus with deflection frequency modulation of the focus voltage, comprising:
   a source of a first signal at a frequency that is related to a deflection frequency;
   switching means responsive to said first signal for producing piecewise linearized portions of a modulation signal, during corresponding portions of a trace interval of a deflection cycle;
   a source of a high voltage; and
   means coupled to said high voltage source and to said switching means for generating said focus voltage that is modulated in accordance with said modulation signal.

2. An apparatus according to claim 1, wherein said first signal is a sawtooth signal, and wherein a ratio between a rate of change of a portion of said modulation signal and a rate of change of said sawtooth signal is substantially constant, during a corresponding portion of said trace interval.

3. An apparatus according to claim 1 further comprising, means responsive to said first signal for generating a first sawtooth signal, wherein said switching means is responsive to said first sawtooth signal for coupling said first sawtooth signal to said focus voltage generating means during a first portion of said trace interval, and for decoupling said first sawtooth signal from said focus voltage generating means, during a second portion of said trace interval, in accordance with a magnitude of said first sawtooth signal.

4. An apparatus according to claim 3 further comprising, a source of a second sawtooth signal that varies in an opposite direction with respect to said first sawtooth signal, wherein said switching means couples said first and second sawtooth signals to said focus voltage generating means during said first and second portions of said trace interval, respectively.

5. An apparatus according to claim 1 wherein said modulation signal varies in a trapezoidal manner during said trace interval.

6. An apparatus with for generating a focus voltage, comprising:
   a source of a sawtooth signal at a frequency that is related to a deflection frequency;
   means responsive to said sawtooth signal for generating a first portion of a modulation signal, during a first portion of a trace interval, having a rate of change that is determined in accordance with said sawtooth signal;
   clamping mean coupled to said modulation signal generating means for generating a second portion of said modulation signal that is clamped to a predetermined clamping level, during a second portion of said trace interval;
   a source of a high voltage; and
   means responsive to said modulation signal and coupled to said source of high voltage for generating therefrom said focus voltage.

7. An apparatus according to claim 6, further comprising, means for generating a second sawtooth signal at a frequency that is related to said deflection frequency that varies in opposite directions with respect to said first sawtooth signal, wherein said modulation signal generating means comprises switching means responsive to said second sawtooth signal for generating a third ramping portion of said modulation signal that varies in opposite direction with respect to said first portion of said modulation signal such that said clamped, second portion of said modulation signal occurs between said first and third portions of said modulation signal.

8. An apparatus according to claim 7 wherein said switching means comprises first and second diodes for coupling said first and second sawtooth signals, respectively, to said clamping means.

9. An apparatus according to claim 6 wherein said clamping means comprises a bipolar transistor and wherein said modulation signal is developed at an emitter electrode of said transistor.

10. An apparatus according to claim 9 further comprising, an emitter follower responsive to said modulation signal and coupled to said focus voltage generating means for providing temperature compensation for temperature related variations in each of said diodes and said bipolar transistor of said clamping means.

* * * * *